US009535245B1

(12) United States Patent
Kowalevicz (10) Patent No.: US 9,535,245 B1
(45) Date of Patent: Jan. 3, 2017

(54) METHODS AND APPARATUS FOR DECEIVING OPTICAL AUGMENTATION

(71) Applicant: RAYTHEON COMPANY, Waltham, MA (US)

(72) Inventor: Andrew Kowalevicz, Alexandria, VA (US)

(73) Assignee: RAYTHEON COMPANY, Waltham, MA (US)

( * ) Notice: Subject to any disclaimer, the term of this patent is extended or adjusted under 35 U.S.C. 154(b) by 984 days.

(21) Appl. No.: 13/714,812

(22) Filed: Dec. 14, 2012

(51) Int. Cl.
*G02B 26/00* (2006.01)
*H04B 10/00* (2013.01)
*H01L 27/00* (2006.01)
*G02B 26/08* (2006.01)
*H01L 27/146* (2006.01)

(52) U.S. Cl.
CPC ..... *G02B 26/0841* (2013.01); *H01L 27/14643* (2013.01)

(58) Field of Classification Search
CPC .............. B82Y 20/00; G02F 1/29; B60R 1/12; B60R 1/082; B60R 1/081; H04B 10/2587; G02B 26/0841; G02B 13/00; G02B 23/00; G02B 5/06; G02B 26/001; G02B 5/04
USPC ....... 359/291, 362, 419, 423, 831, 838, 850, 359/855–856, 290, 292, 237, 238, 244, 359/245, 315, 318; 398/169–170; 250/221, 214.1, 216, 339.01, 339.06, 250/208.1
See application file for complete search history.

(56) References Cited

U.S. PATENT DOCUMENTS

| 4,836,672 | A | 6/1989 | Naiman et al. |
| 5,602,393 | A | 2/1997 | Gerard |
| 5,629,492 | A | 5/1997 | Gleason |
| 5,844,727 | A | 12/1998 | Partlo |
| 6,439,728 | B1 | 8/2002 | Copeland |
| 6,721,539 | B1 | 4/2004 | O'Brien et al. |
| 6,862,147 | B1 | 3/2005 | Sonstroem |
| 6,974,219 | B1 | 12/2005 | Geneczko et al. |
| 7,282,695 | B2 | 10/2007 | Weber et al. |
| 7,576,791 | B2 | 8/2009 | Sonstroem |
| 7,667,598 | B2 | 2/2010 | Yenisch et al. |
| 8,063,348 | B1 | 11/2011 | Swaminathan et al. |
| 8,228,582 | B1 | 7/2012 | Pepper et al. |
| RE43,681 | E | 9/2012 | Wild et al. |
| 2002/0018505 | A1* | 2/2002 | Basting .................. B23K 26/12 372/55 |
| 2004/0130769 | A1* | 7/2004 | Sayyah ................... G01S 17/74 359/240 |
| 2006/0234191 | A1 | 10/2006 | Ludman |

(Continued)

FOREIGN PATENT DOCUMENTS

| WO | 2005082027 A2 | 9/2005 |
| WO | 2006078397 A2 | 7/2006 |
| WO | 2009151660 A2 | 12/2009 |

OTHER PUBLICATIONS

US RE42,554, 07/2011, Wild et al. (withdrawn)

(Continued)

*Primary Examiner* — Dawayne A Pinkney
(74) *Attorney, Agent, or Firm* — Lando & Anastasi, LLP (57) ABSTRACT

In one example a method of deceiving an optical augmentation device includes receiving an interrogation beam at an optical system from the optical augmentation device, encoding the interrogation beam with a false signature misidentifying the optical system, and retro-reflecting the encoded interrogation beam to the optical augmentation device, without retro-reflecting the original interrogation beam.

16 Claims, 3 Drawing Sheets

(56) References Cited

U.S. PATENT DOCUMENTS

2009/0213467 A1* 8/2009 Mitra .................. G02B 3/0006
  359/624
2009/0237668 A1  9/2009 Reyes, Jr. et al.
2010/0283848 A1  11/2010 Adler et al.
2012/0200700 A1  8/2012 Bennett et al.

OTHER PUBLICATIONS

Chevalier, William J., "Assessment of Glint Hazard to Soldiers", U.S. Army Soldier and Biological Command, Dec. 1998.
Fulghum, David A., "Sensor Versus Sensor in Combat", http://www.aviationweek.com/aw/blogs/defense/index.jsp?plckController=Blog&plckScript=blogScript&plckElementId=blogDest&plckBlogPage=BlogViewPost&plckPostId=Blog:27ec4a53-dcc8-42d0-bd3a-01329aef79a7Post:6b5204db-3e13-4728-a30e-5408e1711e6e Jan. 7, 2010.
Mieremet, Arjan L. et al., "Retroreflection Reduction by Masking Apertures", Optical Engineering, Abstract Only, vol. 49, No. 4, Apr. 1, 2010.

* cited by examiner

METHODS AND APPARATUS FOR DECEIVING OPTICAL AUGMENTATION

FEDERALLY SPONSORED RESEARCH

This invention was made with government support (Grant No. and federal agency withheld). The government of the United States has certain rights in this invention.

BACKGROUND

Imaging and optical sensing devices are widely used in both commercial and military applications. In traditional configurations of focused optical imaging or sensing systems, a sensor array is located in the image plane and oriented perpendicular to the optical axis. This configuration is necessary to keep the image in focus across the entire active area of the imaging detector; however this configuration makes the system retro-reflective. As a result, any light not absorbed by the sensor (e.g., a camera or focal plane array sensor) is reflected and imaged directly back to the source along the same optical path as the incident light (i.e., retro-reflected).

Optical augmentation (OA) systems use this property of retro-reflection to detect hidden optical systems. For example, an OA interrogator uses an active light source to sweep through an environment, illuminating any target optical devices. Traditional optical systems produce a "cat's eye" effect in which any unabsorbed light from the illuminating beam is retro-reflected back to the OA interrogator. The retro-reflection reveals the location of the illuminated target optical system, as well as type of sensor used in the system. The sensor type may be linked to the type of hardware it supports, along with its the associated capabilities and vulnerabilities.

SUMMARY OF INVENTION

Aspects and embodiments are directed to systems and methods for deceiving optical augmentation systems.

According to one embodiment an optical system comprises a structured relay optic configured to receive electromagnetic radiation representing a source image volume, the electromagnetic radiation including an interrogation beam from an interrogating device, the structured relay optic further configured to slice the source image volume into a plurality of image slices and to reimage the plurality of image slices onto a tilted image plane that is tilted relative to an optical axis of the optical system, an imaging detector aligned with the tilted image plane and configured to reconstruct a an image from the plurality of image slices, and to reflect the interrogation beam off-axis with respect to the optical axis, the imaging detector having a first signature, a reflector configured to receive and reflect a portion of the interrogation beam to provide a retro-reflection, the reflector further configured to encode the retro-reflection with a second signature different from the first signature, and a beamsplitter configured to direct the portion of the interrogation beam to the reflector, and to return the retro-reflection to the interrogating device.

In one example the structured relay optic is configured to spatially position the plurality of image slices such that a depth of focus of each image slice overlaps the tilted image plane. In one example the imaging detector is a focal plane array. The optical system may further comprise foreoptics positioned in the optical path and configured to direct the electromagnetic radiation to the structured relay optic. In one example the beamsplitter is positioned in the optical path between the foreoptics and the structured relay optic. The reflector may be a second imaging detector or an active device, for example. In one example, the reflector includes a reflective coating configured to produce the second signature. The optical system may further comprise a controller coupled to the reflector. In one example the reflector includes a plurality of reflectors, each configured to produce a different second signature, and the controller is configured to select one of the plurality of reflectors to provide the retro-reflection. In another example the optical system further comprises a threat detection sensor coupled to the controller and configured to receive and analyze the interrogation beam to determine information about the interrogating device, and wherein the controller is configured to receive the information from the threat detection sensor and to control the reflector to adjust the second signature based on the information.

According to another embodiment, a method of deceiving an optical augmentation device comprises receiving an interrogation beam at an optical system from the optical augmentation device, encoding the interrogation beam with a false signature mis-identifying the optical system, and retro-reflecting the encoded interrogation beam to the optical augmentation device.

In one example the method further comprises receiving the interrogation beam at a primary imaging detector of the optical system, and reflecting the interrogation beam from the primary imaging detector off-axis with respect to an optical axis of the optical system to eliminate any retro-reflection from the primary imaging detector. The primary imaging detector may have a first signature, and encoding the interrogation beam with the false signature may include encoding the interrogation beam with a second signature different from the first signature. The method may further comprise imaging a scene with the primary imaging detector. In one example imaging the scene includes segmenting a source image volume of the scene into a plurality of image slices, each image slice having an image volume, individually reimaging the plurality of image slices onto a tilted image plane tilted with respect to an optical axis of the optical system such that the image volume of each image slice overlaps the tilted image plane, the primary imaging detector being aligned with the tilted image plane, and reconstructing a substantially in-focus image at the primary imaging detector from the plurality of image slices. Encoding the interrogation beam may include directing the interrogation beam to a reflector having the false signature. In another example the method further comprises analyzing the interrogation beam to determine information about the optical augmentation device, and configuring the second signature based on the information.

According to another embodiment, a method of deceiving an optical augmentation device comprises receiving an interrogation beam at an optical system from the optical augmentation device, analyzing the interrogation beam to determine information about the optical augmentation device, generating a return signal having characteristics selected based on the information, and directing the return signal to the optical augmentation device.

In one example, the method further comprises receiving the interrogation beam at a primary imaging detector of the optical system, and reflecting the interrogation beam from the primary imaging detector off-axis with respect to an optical axis of the optical system to eliminate any retro-reflection from the primary imaging detector. In another example in which the primary imaging detector has a first signature, generating the return signal includes generating the return signal with a signature that is based on the information and different from the first signature.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and embodiments are directed to methods and apparatus that provide the capability to deceive an optical augmentation (OA) device by replacing the expected retro-reflection with a false optical signal. As discussed in more detail below, optical imaging systems according to various embodiments may be configured to implement "sliced source" imaging in which a structured relay optic segments or slices a source image and reimages the individual slices onto a tilted image plane such that the entire image is faithfully reconstructed. An imaging detector is aligned with the tilted imaging plane. In this manner, a segmented image plane is achieved, tilted or rotated in angle with respect to the optical axis of the optical system. The tilted image plane results in the optical system being non-retro-reflective, while the segmentation of the image plane allows a substantially in-focus image to be maintained at the imaging detector. Thus, the imaging function of the optical system remains intact, while retro-reflections that could be used by optical augmentation devices are eliminated.

According to certain embodiments, while no retro-reflection is emitted from the imaging detector on the tilted image plane, the optical system is configured to emit a "false" retro-reflection from an optical reflector that is configured to encode or otherwise modify the retro-reflection to provide false information to an interrogating optical augmentation device, as discussed further below. In this manner, optical augmentation devices may be deceived, without disrupting any imaging functions of the modified optical imaging system.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 1:
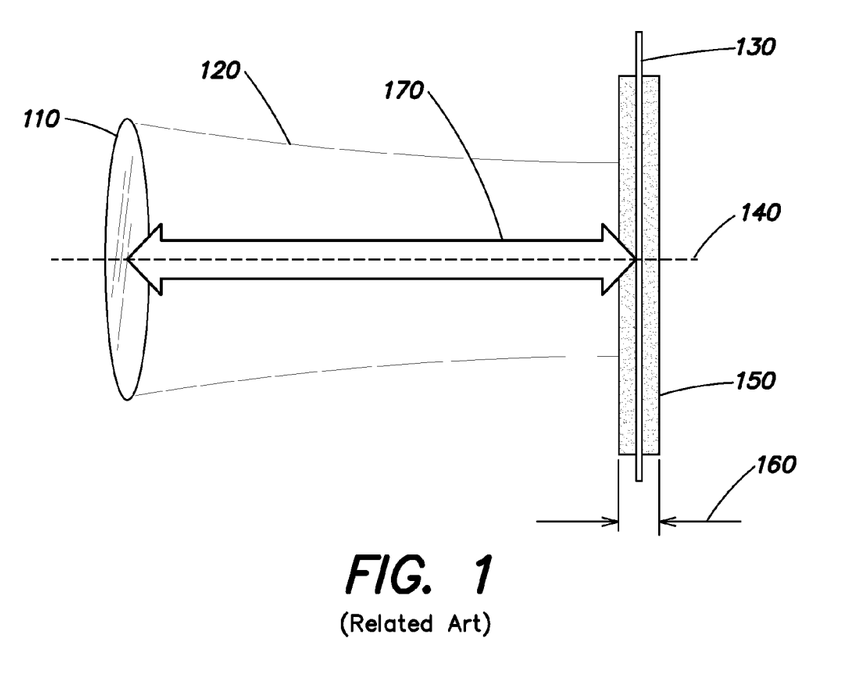
FIG. 1 is a diagram of one example of a conventional, retro-reflective imaging system.

Referring to FIG. 1, there is illustrated an example of a conventional imaging system. Fore-optics 110, such as one or more lenses, for example, focuses light 120 onto a focal plane array (or other imaging sensor) 130 that is positioned normal to the optical axis 140 (along which the light 120 travels). The image formed by this system is in focus over the entire image area (not shown) because the image volume 150, which corresponds to the depth of focus 160 of the system multiplied by the image area, overlaps the surface of the focal plane array 130, as shown in FIG. 1. However, with this type of conventional optical system, any incoming interrogation beam 170 is retro-reflected back along the optical axis 140. This retro-reflection makes the optical system easily detectable by optical augmentation systems, as discussed above.

Figure 2:
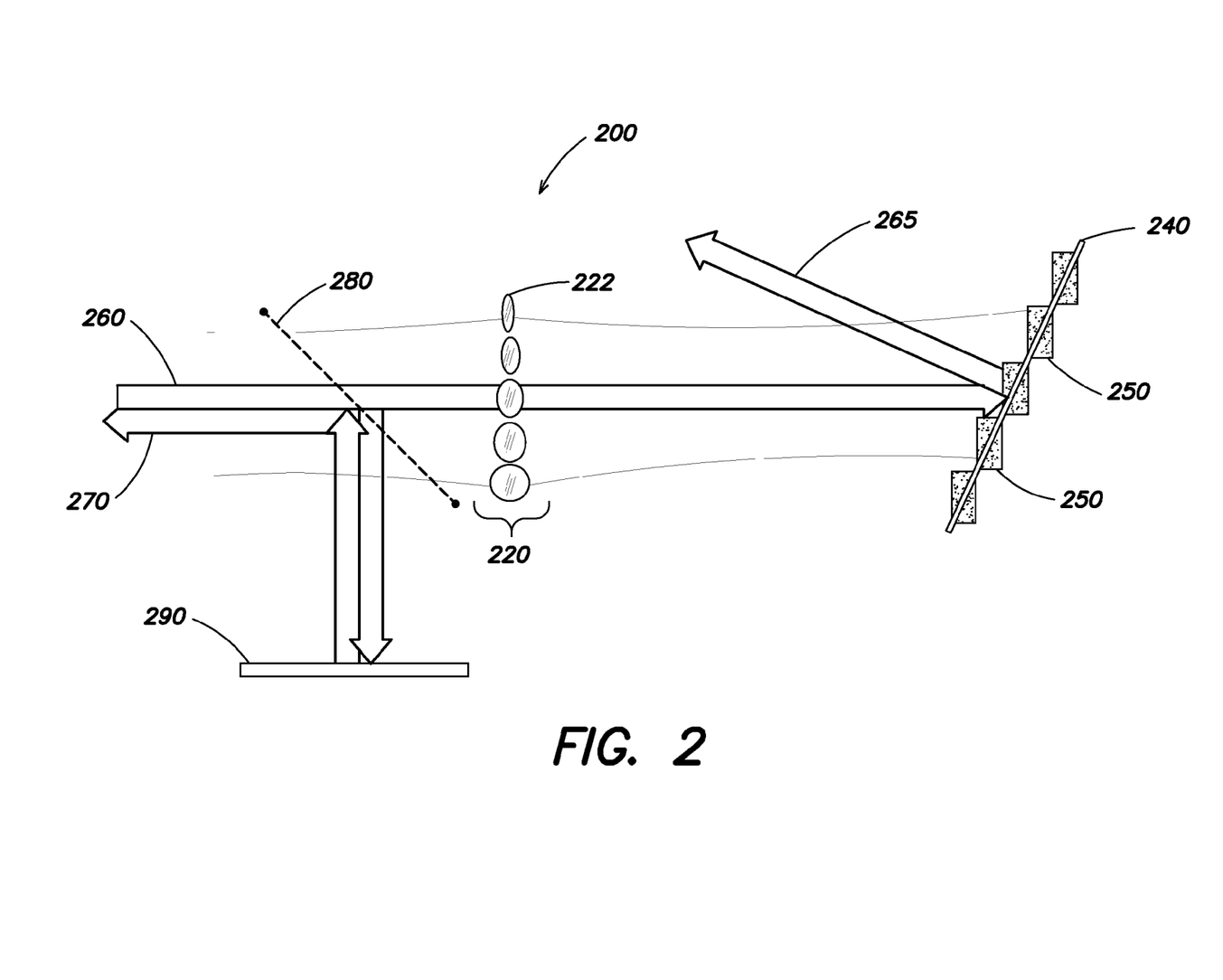
FIG. 2 is a diagram of one example of an optical imaging system according to aspects of the invention.

According to one embodiment, retro-reflection may be avoided by tilting or rotating the focal plane array (or other imaging sensor) relative to the optical axis, and reconfiguring the optical system to implement sliced source imaging so as to maintain an in-focus image. FIG. 2 illustrates an example of a non-retro-reflective optical imaging system 200 according to one embodiment. The optical imaging system 200 is configured to implement sliced source imaging to avoid retro-reflection from the imaging detector 240, and to emit a deliberate return signal, referred to as a "false" retro-reflection 270, to deceive optical augmentation devices.

Referring to FIG. 2, a relay optic 220 images a source (either a previously-formed image or object itself) onto a tilted, or rotated, imaging detector 240 that is aligned and coincident with a second, tilted image plane. The imaging detector 240 may be a focal plane array (FPA), for example. The relay optic 220 is configured to slice the image volume into a plurality of slices 250 and reimage each slice individually onto the tilted imaging detector 240. As illustrated in FIG. 2, in one example, the relay optic 220 is configured to reimage each slice 250 at a slightly different focus position, such that the depth of focus of each slice overlaps the second image plane. In this manner, a substantially complete overlap may be achieved between the tilted imaging detector 240 and the reconstructed image volume comprised of the plurality of slices 250. Thus, substantially the entire image formed at the imaging detector 240 may be in focus. In addition, because the imaging detector 240 is tilted with respect to the optical axis of the system, reflections of incident electromagnetic radiation from the imaging detector 240 can be prevented from returning to the source. As a result, the optical sensor system 200 may achieve excellent image formation without retro-reflection.

The relay optic 220 may be implemented using an array of lenses and/or mirrors. In one embodiment the relay optic 220 is segmented into elements 222 as shown in FIG. 2. In one example, each element 222 of the relay optic 220 has the same reflecting angle, but with a uniform progression of delay distances relative to one another such that the image slices have different optical path lengths, as illustrated in FIG. 2. However, in other examples the reflecting angles may be different. In one example, the relay optic 220 is a lenslet array comprised of a plurality of lenslets, each having a different focal length. In this example, since each lenslet has a different focal length, each lenslet forms an image portion (corresponding to a slice 250) at a slightly different distance from the relay optic 220. The focal lengths of the lenslets may be selected such that the distances at which the image slices 250 are formed corresponds to the tilt of the second image plane, and the depth of focus of each slice overlaps the imaging detector 240, as illustrated in FIG. 2. In other examples, depending on the overall optical design, the focal length of the lenslets may be the same. Furthermore, in other examples, the relay optic 220 may be constructed using optical elements other than lenses, such as a faceted or stepped mirror, an array of mirrors, or a deformable mirror or mirror array, for example. The relay optic 220 may be implemented in numerous different ways and, regardless of physical implementation, functions to "slice" the source image and reimage each of the slices individually onto a rotated image plane such that a substantially in-focus reconstruction of the entire image is obtained, while substantially eliminating retro-reflection from the system. Various embodiments, examples, and demonstrations of sliced source imaging systems and methods are discussed in commonly-owned, co-pending U.S. application Ser. No. 13/680,950 filed on Nov. 19, 2012 and titled "METHODS AND APPARATUS FOR IMAGING WITHOUT RETRO-REFLECTION," which is incorporated herein by reference in its entirety. Any of these embodiments or examples may be used to implement the optical sensor system 200.

Referring again to FIG. 2, as discussed above, in addition to performing one or more imaging functions using the imaging detector 240, the optical sensor system 200 may be configured to emit a false retro-reflection 270 to provide false, deceiving information to optical augmentation devices. An interrogating device (not shown) emits a bright light, a portion of which reaches the optical sensor system 200 and enters though an input aperture (e.g., via the optics 220) as an interrogation beam 260. The interrogation beam 260 is incident on the imaging detector 240. However, since the imaging detector 240 is rotated (or tilted), rather than being retro-reflected back to the interrogating device, the interrogation beam 260 is reflected at an angle (reflected beam 265), as shown in FIG. 2.

According to one embodiment, while retro-reflections from the imaging detector 240 are eliminated through the slice source imaging techniques discussed above, the optical system 200 is configured to emit a modified retro-reflection 270 that is designed to provide false information to the optical augmentation device. In one example, a beamsplitter 280 is placed in the optical path and configured to allow some incident electromagnetic radiation through to the imaging detector 240, while directing at least a portion of the interrogation beam 260 to a reflector 290. The reflector 290 retro-reflects the interrogation beam 260 to provide the false retro-reflection 270.

The reflector 290 may be selected or configured to provide certain false information in the retro-reflection 270 designed to deceive interrogating optical augmentation devices. For example, retro-reflections from optical devices, such as imaging detectors, contain information about the type of optical device that produced the retro-reflection because characteristics of the device affect the retro-reflected light (referred to as the "signature" of the device on the retro-reflection). In addition, the retro-reflection may provide some range information to the interrogating optical augmentation device, for example, based on round-trip time-of-flight measurements, or other distance-measuring techniques. According to one embodiment, the characteristics of the reflector 290 are tailored to provide a signature equivalent to the expected retro-reflection from an imaging system or detector that is different from the imaging detector 240 and associated optical system. When the incoming interrogation beam 260 strikes the reflector 290, it is encoded with the false signature. The reflected lights from the reflector 290 is imaged (using additional optics, not shown in FIG. 2, as will be appreciated by those skilled in the art, given the benefit of this disclosure) onto the beamsplitter 280, and retro-reflected (beam 270) back to the interrogating optical augmentation device. Thus, since the optical augmentation device receives the retro-reflection 270 encoded with the false signature from the reflector 290 instead of the true signature from the imaging detector 240, the optical system 200 appears to the interrogating optical augmentation device as something other than what it is, thereby deceiving the optical augmentation device.

According to one embodiment, several reflectors 290 with different characteristics may be used interchangeably to provide different false signatures to interrogating devices. The reflector 290 may include an actual imaging detector (or portion thereof) that is different from the imaging detector 240, or another type of device that is constructed to provide a signature that appears to be the signature of an imaging detector. For example, the reflector 290 may be provided with a coating that has specific reflective properties that cause the signature of the reflector to emulate a certain type of imaging detector or other optical device. The reflector 290 may be a passive device (such as an imaging detector) or an active device. In embodiments in which the reflector 290 is an active device, the reflector may be configured to replace or augment the retro-reflection 270 with a generated return signal which may be used to deceive or even destroy the interrogating device (by returning a very large signal, for example).

Different types of optical devices may have different capabilities, or may be known to be associated with different types of hardware that have different capabilities. For example, the type of imaging detector typically used with optical systems deployed on a tank (e.g., a thermal weapon sight) may be different, and may provide a different signature, from the type of imaging detector or other optics typically used with a rifle scope or other small-arms weapon.

In addition, the reflector 290 is not limited to emulating imaging detectors, but may be configured to appear as any type of retro-reflective optical device. Accordingly, by providing a false signature to an interrogating device, the interrogating device may be deceived as to the type and capabilities of the hardware associated with the optical system 200.

In addition, the reflector 290 may be configured to provide false range information on the retro-reflection 270. For example, the reflector 290 may include an optical delay device that delays the incident interrogation beam 260, such that when the optical augmentation device receives the retro-reflection 270, the optical system 200 appears to be farther away than it actually is. Thus, the interrogating device may be deceived both as to the type of optical system it sees, and the range to that optical system.

Figure 3:
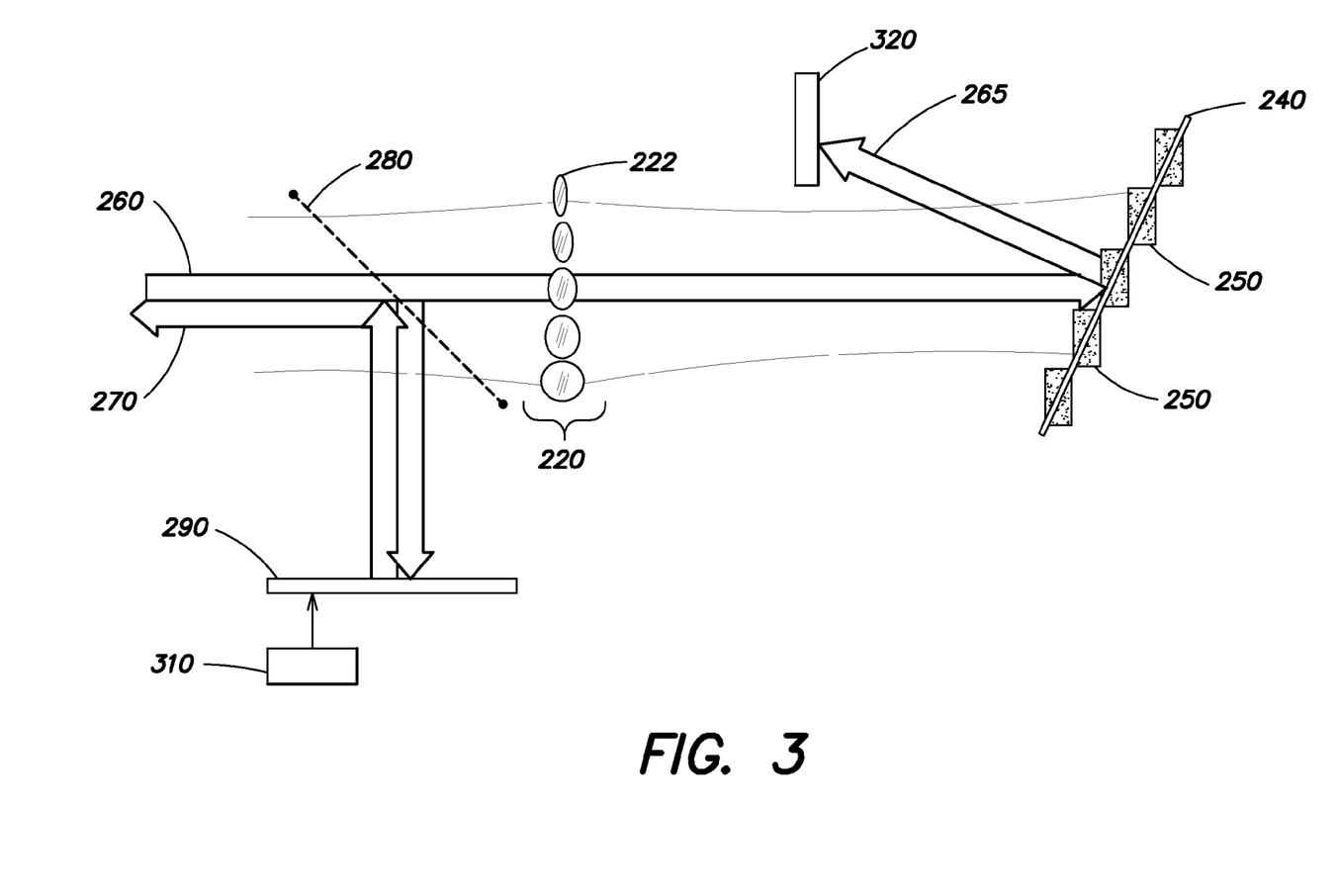
FIG. 3 is a diagram of another example of an optical imaging system according to aspects of the invention.

Referring to FIG. 3, in one embodiment, the optical system 200 may include a controller 310 coupled to the reflector 290. The controller 310 may be configured to alter the characteristics of the reflector, for example, where the reflector is an active device, to change the signature encoded on the retro-reflection 270 by the reflector. Alternatively, the controller 310 may be configured to switch one of several different reflectors, with different signatures, into position to provide the retro-reflection 270. Switching in and out of different reflectors 290 may be achieved in numerous ways, including, for example, by moving the reflectors themselves, or by appropriately directing the incoming and outgoing electromagnetic radiation with optical components, such as movable mirrors, lenses or beamsplitters, for example. Thus, the signature encoded onto the retro-reflection 270 may be dynamically changed to present changing false information to the interrogating optical augmentation device. Alternatively, the reflector 290, or its characteristics, may be manually changed by a user of the optical system 200. Thus, the optical system 200 may be readily configured to "spoof" (i.e., present a false signature emulating) any of numerous different optical devices or systems.

As discussed above, the optical system 200 may be configured such that reflections of the interrogation beam 260 from the imaging detector 240 are off-axis, as shown in FIGS. 2 and 3. According to one embodiment, the optical system may include a threat detection sensor 320 arranged and configured to receive and analyze the reflected beam 265 to determine certain identification information about the interrogating device. For example, the threat detection sensor 320 may analyze the reflected beam 265 to determine characteristics of the interrogation beam 260 such as its wavelength and/or modulation format. The modulation format used for and/or wavelength of the interrogation beam 260 may provide information about the type of interrogating device, which can also be used to categorize likely users of the interrogating device. For example, optical augmentation devices deployed on tanks may be different (i.e., have different modulation formats and/or use different wavelengths) from handheld optical augmentation devices which may be associated with rifles or other small arms. In addition, it may be known that certain types of optical augmentation devices used by certain forces have particular characteristics. Thus, the modulation format and/or wavelength of the interrogation beam 260 may reveal information, which together with known information about certain types of optical augmentation devices, may allow the likely type or "class" of the interrogating device 310, and its user, to be identified.

Various embodiments and examples of optical systems configured to detect and analyze the interrogation beam are discussed in commonly-owned co-pending U.S. patent application Ser. No. 13/714,637 filed on Dec. 14, 2012 and titled "METHODS AND APPARATUS FOR PASSIVE COVERT LOCATION DETECTION AND IDENTIFICATION," which is herein incorporated by reference in its entirety.

According to one embodiment, the controller 310 may be coupled to the threat detection sensor 320 and configured to adjust the characteristics of the reflector 290, or switch in a particular reflector 290, based on the information about the interrogating device determined from the threat detection sensor. For example, the reflector 290 or its characteristics may be selected to have the optical system 200 appear to be a type of system with more (or less) capability than is typically associated with the detected type of interrogating device. As discussed above, in some embodiments in which the reflector 290 is an active device, the retro-reflection 270 may be replaced with a generated return signal. In some examples, the characteristics of this generated return signal may be tailored based on information (such as vulnerabilities) about the interrogating device determined from analysis of the interrogation beam 265 using the threat detection sensor 320.

Thus, according to various aspects and embodiments, an optical imaging system 200 may be used to deceive interrogating devices, such as optical augmentation devices, by eliminating the return signal expected by the interrogating device (i.e., the retro-reflection from the optics being used for the primary function of the optical system 200, such as that from imaging detector 240) and substituting a deceptive signal (retro-reflection 270) in its place. This technique is substantially different from conventional "jamming" systems in which the true retro-reflection still exists (and is still returned to the interrogating device) but is concealed by a larger (higher amplitude) background signal, since according to aspects and embodiments discussed herein the true retro-reflection may be entirely eliminated. This removes the possibility for the interrogating device to "screen out" the background jamming signal and obtain the retro-reflection. As discussed above, embodiments of this deception technique allow for any of a number of different identifying signatures to be generated and used interchangeably to provide the false retro-reflection 270. Accordingly, the optical system 200 may be disguised and made to appear as a very different system which may be associated with very different hardware (e.g., a rifle scope may be disguised as a thermal weapon sight typically associated with a tank, etc.), which may have numerous tactical advantages. This deception technique may be implemented without compromising any imaging functions of the optical system, since through the sliced source imaging techniques, an in-focus image may be maintained even though the imaging detector 240 is tilted with respect to the optical axis to eliminate the true retro-reflection from the imaging detector.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:
1. An optical system comprising:
a structured relay optic configured to receive electromagnetic radiation representing a source image volume, the electromagnetic radiation including an interrogation beam from an interrogating device, the structured relay optic further configured to slice the source image volume into a plurality of image slices and to reimage the plurality of image slices onto a tilted image plane that is tilted relative to an optical axis of the optical system;
foreoptics configured to direct the electromagnetic radiation to the structured relay optic;
an imaging detector aligned with the tilted image plane and configured to reconstruct a an image from the plurality of image slices, and to reflect the interrogation beam off-axis with respect to the optical axis, the imaging detector having a first signature;

a reflector configured to receive and reflect a portion of the interrogation beam to provide a retro-reflection, the reflector further configured to encode the retro-reflection with a second signature different from the first signature; and a beamsplitter positioned in an optical path between the foreoptics and the structured relay optic, the beamsplitter configured to direct the portion of the interrogation beam to the reflector, and to return the retro-reflection to the interrogating device.

2. The optical system of claim 1, wherein the structured relay optic is configured to spatially position the plurality of image slices such that a depth of focus of each image slice overlaps the tilted image plane.

3. The optical system of claim 1, wherein the imaging detector is a focal plane array.

4. The optical system of claim 1, wherein the reflector is a second imaging detector.

5. The optical system of claim 1, wherein the reflector includes a reflective coating configured to produce the second signature.

6. The optical system of claim 1, further comprising a controller coupled to the reflector.

7. The optical system of claim 6, wherein the reflector includes a plurality of reflectors, each configured to produce a different second signature; and wherein the controller is configured to select one of the plurality of reflectors to provide the retro-reflection.

8. The optical system of claim 1, further comprising a threat detection sensor coupled to the controller and configured to receive and analyze the interrogation beam to determine information about the interrogating device, wherein the controller is configured to receive the information from the threat detection sensor and to control the reflector to adjust the second signature based on the information.

9. An optical system comprising:

a structured relay optic configured to receive electromagnetic radiation representing a source image volume, the electromagnetic radiation including an interrogation beam from an interrogating device, the structured relay optic further configured to slice the source image volume into a plurality of image slices and to reimage the plurality of image slices onto a tilted image plane that is tilted relative to an optical axis of the optical system;

an imaging detector aligned with the tilted image plane and configured to reconstruct a an image from the plurality of image slices, and to reflect the interrogation beam off-axis with respect to the optical axis, the imaging detector having a first signature;

a reflector configured to receive and reflect a portion of the interrogation beam to provide a retro-reflection, the reflector further configured to encode the retro-reflection with a second signature different from the first signature;

a beamsplitter configured to direct the portion of the interrogation beam to the reflector, and to return the retro-reflection to the interrogating device;

a controller coupled to the reflector; and a threat detection sensor coupled to the controller and configured to receive and analyze the interrogation beam to determine information about the interrogating device;

wherein the controller is configured to receive the information from the threat detection sensor and to control the reflector to adjust the second signature based on the information.

10. The optical system of claim 9, wherein the structured relay optic is configured to spatially position the plurality of image slices such that a depth of focus of each image slice overlaps the tilted image plane.

11. The optical system of claim 9, wherein the imaging detector is a focal plane array.

12. The optical system of claim 9, wherein the reflector is a second imaging detector.

13. The optical system of claim 9, wherein the reflector includes a reflective coating that produces the second signature.

14. The optical system of claim 9, wherein the reflector includes a plurality of reflectors, each configured to produce a different second signature; and wherein the controller is configured to select one of the plurality of reflectors to provide the retro-reflection.

15. A method of deceiving an optical augmentation device comprising:

receiving an interrogation beam at a primary imaging detector of an optical system from the optical augmentation device, the primary imaging detector having a first signature and being aligned with a tilted image plane that is tilted with respect to an optical axis of the optical system;

reflecting the interrogation beam from the primary imaging detector off-axis with respect to the optical axis to eliminate any retro-reflection from the primary imaging detector;

using a beamsplitter, directing a portion of the interrogation beam toward a reflector;

receiving the portion of the interrogation beam at a threat detection sensor;

analyzing the portion of the interrogation beam with the threat detection sensor to determine information about the optical augmentation device;

at the reflector, encoding the portion of the interrogation beam with a false signature based on the information to provide an encoded interrogation beam, the false signature mis-identifying the optical system and being different from the first signature;

retro-reflecting the encoded interrogation beam with the beamsplitter to the optical augmentation device; imaging a scene with the primary imaging detector; wherein imaging the scene includes: segmenting a source image volume of the scene into a plurality of image slices, each image slice having an image volume; individually reimaging the plurality of image slices onto the tilted image plane tilted with respect to the optical axis of the optical system such that the image volume of each image slice overlaps the tilted image plane; and reconstructing a substantially in-focus image at the primary imaging detector from the plurality of image slices.

16. A method of deceiving an optical augmentation device comprising:

receiving an interrogation beam at a primary imaging detector of an optical system from the optical augmentation device, the primary imaging detector having a first signature;

reflecting the interrogation beam from the primary imaging detector off-axis with respect to an optical axis of the optical system to eliminate any retro-reflection from the primary imaging detector;

receiving and analyzing the interrogation beam with a threat detection sensor to determine information about the optical augmentation device;

generating a return signal having a second signature based on the information by encoding a portion of the interrogation beam with the second signature, the second signature being different from the first signature;

retro-reflecting the return signal to the optical augmentation device; imaging a scene with the primary imaging detector; wherein imaging the scene includes: segmenting a source image volume of the scene into a plurality of image slices, each image slice having an image volume; individually reimaging the plurality of image slices onto a tilted image plane tilted with respect to the optical axis of the optical system such that the image volume of each image slice overlaps the tilted image plane; and reconstructing a substantially in-focus image at the primary imaging detector from the plurality of image slices.

* * * * *